United States Patent

Shiau et al.

[11] Patent Number: 5,866,483
[45] Date of Patent: Feb. 2, 1999

[54] METHOD FOR ANISOTROPICALLY ETCHING TUNGSTEN USING $SF_6$, $CHF_3$, AND $N_2$

[75] Inventors: Guang-Jye Shiau, San Jose; Paul Herz, Sunnyvale; Xian-Can Deng, Santa Clara; Xiaobing Diana Ma, Saratoga, all of Calif.

[73] Assignee: Applied Materials, Inc., Santa Clara, Calif.

[21] Appl. No.: 833,413

[22] Filed: Apr. 4, 1997

[51] Int. Cl.[6] ................................. H01L 21/00
[52] U.S. Cl. ..................... 438/720; 216/67; 216/75; 252/79.1; 438/733; 438/742
[58] Field of Search ................. 438/720, 733, 438/742; 216/67, 75; 252/79.1

[56] References Cited

U.S. PATENT DOCUMENTS

| | | | |
|---|---|---|---|
| 4,666,555 | 5/1987 | Tsang | 156/643 |
| 4,705,595 | 11/1987 | Okudaira et al. | 156/643 |
| 4,915,777 | 4/1990 | Jucha et al. | 156/643 |
| 4,948,462 | 8/1990 | Rossen | 438/720 X |
| 4,992,136 | 2/1991 | Tachi et al. | 156/643 |
| 4,994,410 | 2/1991 | Sun et al. | 437/192 |
| 5,013,398 | 5/1991 | Long et al. | 156/643 |
| 5,035,768 | 7/1991 | Mu et al. | 156/626 |
| 5,110,408 | 5/1992 | Fujii et al. | 156/643 |
| 5,110,411 | 5/1992 | Long | 156/656 |
| 5,118,387 | 6/1992 | Kadomura | 156/657 |
| 5,164,330 | 11/1992 | Davis et al. | 437/192 |
| 5,176,792 | 1/1993 | Fullowan et al. | 156/652 |
| 5,354,417 | 10/1994 | Cheung et al. | 156/643 |
| 5,358,601 | 10/1994 | Cathey | 156/656 |
| 5,514,622 | 5/1996 | Bornstein et al. | 437/189 |
| 5,521,119 | 5/1996 | Chen et al. | 437/187 |
| 5,747,383 | 5/1998 | Chen et al. | 438/720 X |

FOREIGN PATENT DOCUMENTS

| | | |
|---|---|---|
| 0463373A2 | 1/1992 | European Pat. Off. . |
| 0516043A2 | 12/1992 | European Pat. Off. . |
| 0788147 | 1/1997 | European Pat. Off. . |
| 4105320 | 4/1992 | Japan . |

OTHER PUBLICATIONS

Aydil, et al., "Multiple Steady States in a Radio Frequency Chlorine Glow Discharge," *J. Appl. Phys.*, vol. 69, No. 1, pp. 109–114 (Jan. 1, 1991).

*Primary Examiner*—William Powell
*Attorney, Agent, or Firm*—Ashok K. Janah; James C. Wilson

[57] ABSTRACT

A method for etching a tungsten containing layer 25 on a substrate 10 substantially anisotropically, with good etching selectivity, and without forming excessive passivating deposits on the etched features. In the method, the substrate 10 is placed in a plasma zone 55, and process gas comprising $SF_6$, $CHF_3$, and $N_2$, is introduced into the plasma zone. A plasma is formed from the process gas to anisotropically etch the tungsten containing layer 22. Preferably, the plasma is formed using combined inductive and capacitive plasma operated at a predefined inductive:capacitive power ratio.

22 Claims, 3 Drawing Sheets

METHOD FOR ANISOTROPICALLY ETCHING TUNGSTEN USING SF$_6$, CHF$_3$, AND N$_2$

BACKGROUND

The present invention relates to a method for etching tungsten containing material on a substrate.

In integrated circuit fabrication, refractory metals, such as for example tungsten, tantalum, titanium, molybdenum, and their silicides, are used to form high density, high speed, electrically conductive interconnect lines and/or contact plugs for electrically connecting active semiconducting devices formed on silicon or gallium arsenide substrates. In a typical process, a blanket tungsten layer is deposited over an underlying titanium, titanium-nitride, titanium-tungsten, which serves as an barrier or adhesion layer. This is followed by a masking step in which patterned photoresist features are formed over the tungsten layer. To form interconnect lines on the substrate, an etch step is used to remove the tungsten material from the regions not covered by the photoresist features. Tungsten layers can also be used for filling openings to form electrically conducting contact plugs below interconnect wiring layers, by chemical vapor deposition of a blanket tungsten layer that fills the openings, followed by etching of the blanket tungsten layer to form the desired configuration of interconnect lines and/or plugs. Tungsten is desirable for both interconnect lines and contact plugs because (i) tungsten has a higher melting temperature of about 3410° C. compared to aluminum which melts at 660° C., which allows high temperature processing of the substrate; (ii) tungsten exhibits reduced electromigration or diffusion when applied over a silicon layer, (iii) tungsten reacts with silicon at temperatures exceeding 600°–700° C., whereas aluminum reacts with silicon at lower temperatures of 250° C., (iv) tungsten deposition generally provides more uniform filling of high aspect ratio contact plugs, better step coverage, and reduced formation of electrical discontinuities that cause shorts or breaks.

Conventional processes for etching tungsten containing layers use a capacitive RIE plasma of halogen-containing gases, and more typically fluorinated gases, such as CF$_4$, SF$_6$, CBrF$_3$, and NF. One problem with conventional etching processes lies in their inability to anisotropically etch tungsten containing layers to provide features having substantially vertical sidewalls which are not inwardly or outwardly tapered. Excessive etching at the sidewalls of the etched features results in the undesirable inwardly or outwardly sloped sidewalls.

Conventional tungsten etch methods that provide increased anisotropic etching use gases such as CBr, NF$_3$, or CHF$_3$ to form thick passivating deposits on the sidewalls of the etched features to reduce horizontal etching, as described in *J. Vac. Sci. Technol. B,* page 3272 (1985). However, these methods often result in etched features which have wider dimensions at the base due to the increased thickness of the passivating film that forms on the freshly etched sidewalls of the features as the etch process proceeds to completion. In yet another method, gas mixtures of SF$_6$/CBrF$_3$ or SF$_6$/CHF$_3$ are used to reduce undercutting, but these mixtures nonetheless yield isotropic profiles with substantial undercutting at the base of the etched feature, as for example, disclosed in Tennant, et al., *J. Vac. Sci. Technol. B,* page 71836 (1989). In yet another etching method, as described in U.S. Pat. No. 4,992,136 to Tachi, et al., the tungsten film is etched using (I) an etchant gas such Cl$_2$ or SF$_6$; and (ii) a passivating film forming halogen gas containing C or Si to form deposits on the surface of the substrate during etching, such as CCl$_4$, CF$_4$, CHF$_3$, CHCl$_3$, SiF$_4$, or SiCl$_4$. However, this method generally provides tapered angles for the sidewalls of the etched features because it is difficult to precisely control the ratio of the etchant gas to the film forming gas during the etching process, particularly towards the completion of the etching process when a high concentration of volatile passivating polymeric species is formed in the etchant chamber.

Conventional etching processes also often fail to maintain the critical dimensions of the etched features, which are predefined and desirable dimensions of the etched features, used to determine the electrical properties of the etched features, in the design of integrated circuits. The critical dimensions are those dimensions that have a significant effect on the electrical properties of the etched features. In modern integrated circuits, the line widths of interconnect lines and diameters of contact plugs are becoming increasingly smaller to levels below 0.25 microns, to accommodate higher circuit densities. Because the electrical resistance of these features is proportional to the cross-sectional area of the etched features, it is important to maintain consistent and uniform dimensions without variations of across an etched feature or between different etched features. Tapering cross-sections, cross-sectional profiles that vary as a function of the spacing between the features, or other variations in the profile of the features is no longer acceptable in modern integrated circuits. The critical dimensions are typically measured as a ratio or difference between the width $W_r$ of the resist features and the width $W_e$ of the resultant etched features. The closer the width of the etched feature to that of the resist feature the more predictable and reliable are the electrical properties of the etched feature.

Thus, it is desirable to have a process for etching tungsten-containing layers which exhibits anisotropic etching and provides etched features having substantially straight sidewalls. It is further desirable for the etching process to provide etched features having consistent and reproducible critical dimensions. It is also desirable for the etching process to exhibit reduced and more controllable formation of passivating film deposits on the sidewalls of the etched features. It is further desirable for the etching process to have a large processing window tolerant of process fluctuations and provide a high process throughput.

SUMMARY

The present invention provides highly anisotropic etching of tungsten containing layers on a substrate to provide low loss of critical dimensions and prevent excessive deposition of thick passivating films on the etched features. In one aspect of the method, the substrate is placed in a plasma zone, and a process gas comprising SF$_6$, CHF$_3$, and N$_2$ is introduced into the plasma zone. A plasma generated from the process gas etches the tungsten containing layer on the substrate (i) substantially anisotropically, and (ii) without forming excessive passivating deposits on the substrate. The volumetric flow ratio of SF$_6$:CHF$_3$:N$_2$ is selected so that the tungsten containing layer is etched to provide etched features having sidewalls that form angles of at least about 88° with a surface of the substrate. Preferably, the volumetric flow ratio of SF$_6$:CHF$_3$:N$_2$ is from about 1:1:1 to about 8:1:1.

In another aspect of the present method, the substrate is placed in a process chamber comprising (i) process electrodes therein, and (ii) an inductor coil adjacent to the process chamber. A process gas comprising SF$_6$, CHF$_3$, and $N_2$ is introduced into the process chamber. The process gas is ionized to form plasma ions that energetically impinge on the substrate by (i) applying RF current at a first power level to the inductor coil, and (ii) applying RF voltage at a second power level to the process electrodes. The power ratio $P_r$ of the first power level to the second power level is selected so that the tungsten containing layer is anisotropically etched without excessive deposition of passivating material on the substrate.

DRAWINGS

These and other features, aspects, and advantages of the present invention will become better understood from the following drawings and description, which show and describe examples of the invention, and from the appended claims, where:

FIG. 1a is a schematic partial sectional view of a substrate having a tungsten layer and a patterned resist layer thereon;

FIG. 1b is a schematic partial sectional view of the substrate of FIG. 1a after etching of the tungsten layer showing substantially anisotropically etched features; and FIG. 1c is a schematic partial sectional view of the substrate of FIG. 1b after stripping the resist layer; and FIG. 2 is a schematic view in vertical cross-section of a process chamber suitable for practicing the etching process of the present invention.

DESCRIPTION

Figure 1A:
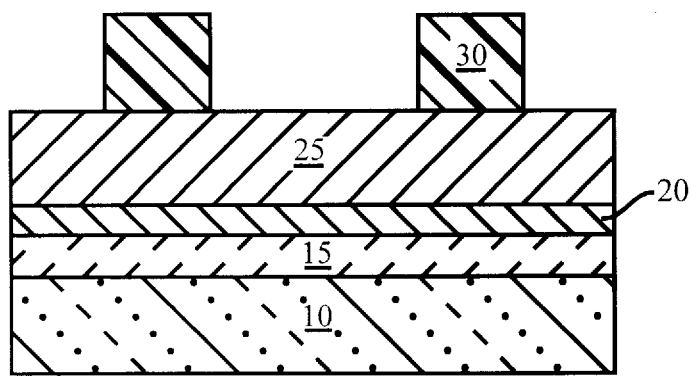
Figure 1B:
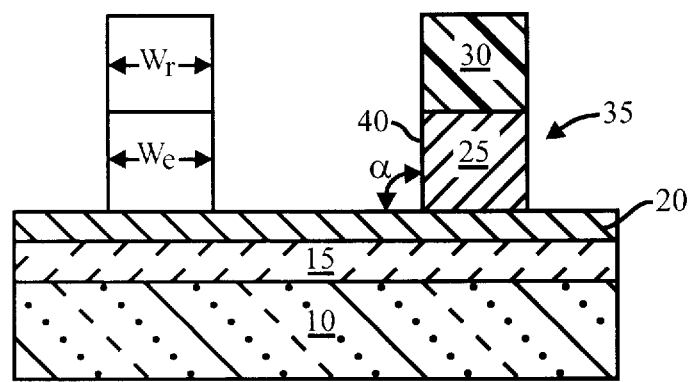
Figure 1C:
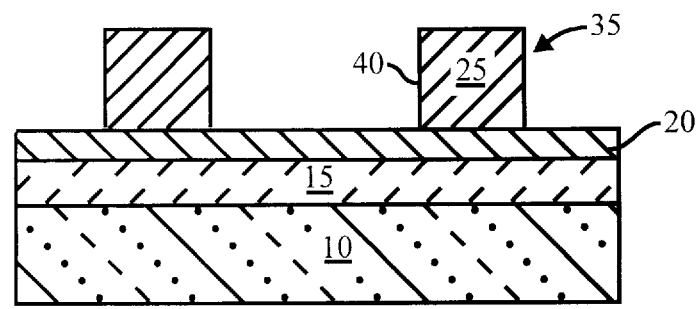

The etching process of the present invention is useful for etching tungsten containing layers formed on a substrate 10 with high anisotropy and reduced passivating deposits, and good etch rates. With reference to FIGS. 1a to 1c, the present process is used to etch a substrate 10 made of any material, such as glass, ceramic, metal, polymer, or a semiconductor substrate, for example silicon or gallium arsenide wafers. A dielectric layer 15 such as doped or undoped silicon dioxide, silicon nitride, BPSG, or PSG (which is typically about 100 to 3000 Å thick) is formed on the substrate 10. The substrate 10 is descummed to remove the native oxide layer on the silicon containing surfaces typically using an $O_2$ plasma. A thin barrier or adhesion layer 20, such as a layer of titanium (Ti), titanium tungsten (Ti—W), or titanium nitride (TiN) having a thickness of 100 to 1000 Å can also be deposited on the substrate 10. A tungsten-containing layer 25 is deposited on the substrate 10 by sputtering from a tungsten target, or by chemical vapor deposition from tungsten source gases, such as tungsten hexafluoride ($WF_6$). For example, commonly assigned U.S. Pat. No. 5,500,249, to Telford et al., which is incorporated herein by reference, describes a chemical vapor deposition process for depositing $WSi_x$ films via plasma enhanced chemical vapor deposition of tungsten hexafluoride and dichlorosilane. The tungsten containing layer 25 typically has a thickness of about 500 Å to about 10,000 Å, and is deposited by a low temperature RF biased sputtering processes.

Conventional photolithographic methods are used to form a patterned resist features 30 covering the tungsten containing layer 25, the resist layer having features dimensioned according to the critical dimensions of the features desired to be etched in the tungsten containing layer. In this step, a layer of resist such as "RISTON" photoresist manufactured by DuPont de Nemours Chemical Company, is applied on the tungsten containing layer 25 to a thickness of about 0.4 to about 1.3 micron. The resist features 30 are defined using conventional lithographic processes in which the resist layer is exposed to a pattern of light through a mask that corresponds to the desired configuration of resist features 30. After the etching process, the protective resist features 30 result in formation of the etched tungsten containing features 35, as shown in FIG. 1b. Thereafter, the residual resist features 30 are removed by conventional resist removing processes to provide a substrate comprising etched tungsten features 35, as shown in FIG. 1c.

Figure 2:
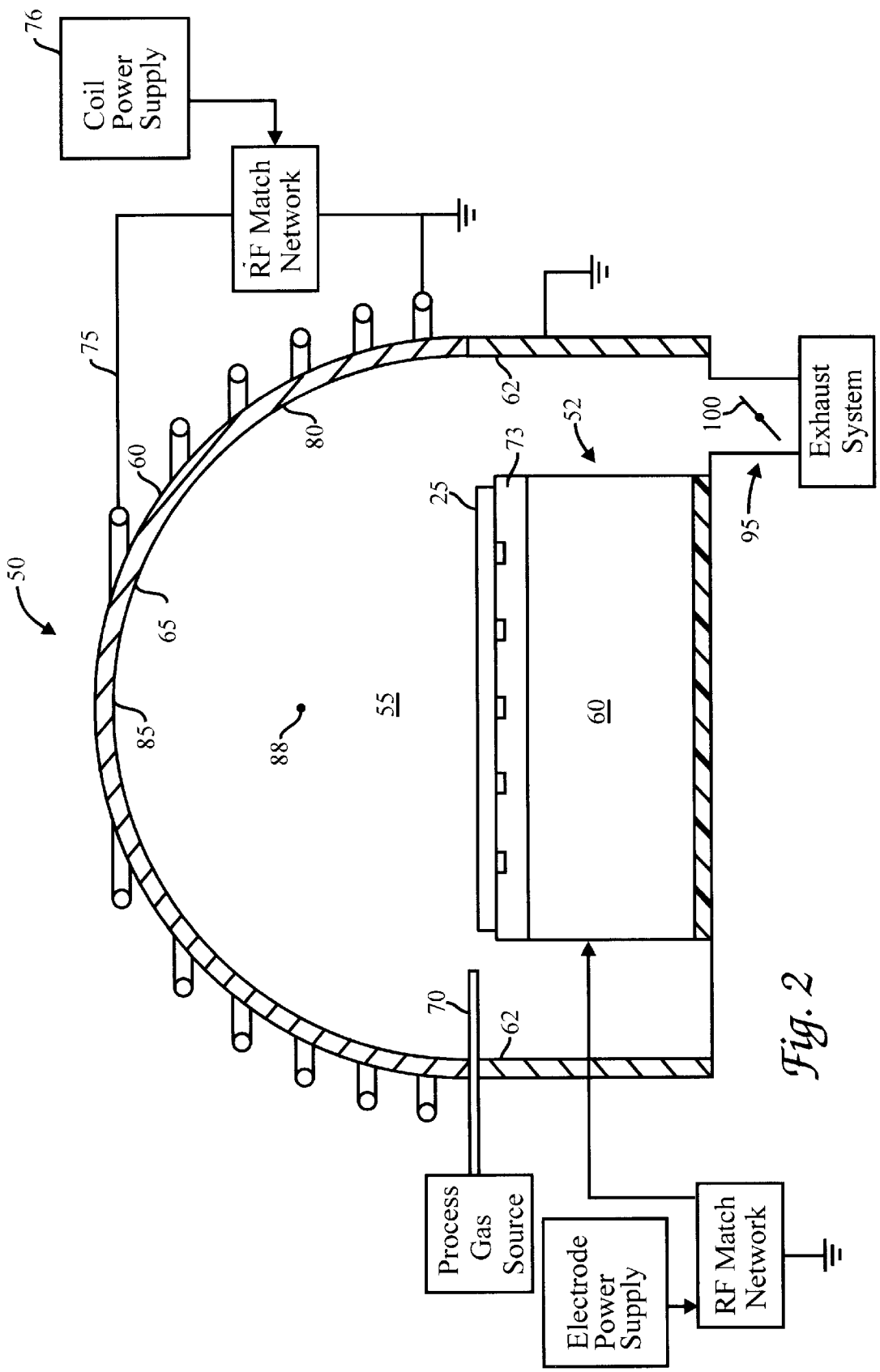

The tungsten containing layer 25 is etched in a process chamber 50, such as for example, a "DPS" chamber, schematically illustrated in FIG. 2, and commercially available from Applied Materials Inc., Santa Clara, Calif. Portions of the process chamber are described in U.S. patent application Ser. Nos. 08/597,445, entitled "RF Plasma Reactor with Hybrid Conductor and Multi-Radius Dome Ceiling" filed on Feb. 2, 1996; and Ser. No. 08/389,889, filed on Feb. 15, 1993—both of which are incorporated herein by reference. The particular embodiment of the process chamber 50 shown herein, is suitable for processing of a semiconductor substrate 10, is provided only to illustrate the invention, and should not be used to limit the scope of the invention. For example, the etching process of the present invention can be used to simultaneously etch multiple substrates, and can be used for manufacturing processes other than semiconductor fabrication.

To perform the etching process, the chamber 50 is evacuated to a low pressure, typically less than about 1 Torr, and a substrate 10 is placed on a support 52 within a plasma zone 55 in the chamber. At least a portion of the support 52 is electrically conductive and serves as a process or cathode electrode 60. The cathode electrode 60, in conjunction with sidewalls of the chamber 50 which are electrically grounded to serve as an anode electrode 65, form process electrodes in the plasma zone 55 that form a capacitive electric field that generates or energizes the plasma in the chamber. The substrate 10 can be held in place during the etching process using a mechanical or electrostatic chuck with grooves in which a coolant gas, such as helium, is held to control the temperature of the substrate 10.

The substrate 10 in the chamber is typically maintained at a temperature of about −20° to 30° C., more preferably −5° to 15° C., and most preferably about 0° to 5° C., by flowing helium gas below the substrate 10 at a pressure of about 1 to 10 Torr. The lower substrate temperatures provide increased control of the cross-sectional profile of the etch features by reducing vaporization of the passivating film formed on the etch features.

Process gas is introduced into the chamber 50 through a gas distributor 70 peripherally disposed about the substrate 10, and the pressure in the chamber is regulated to about 1 to about 1000 mTorr, more typically from 5 to 30 mTorr, and preferably about 10 mTorr. A plasma is formed from the process gas using a plasma generator that couples an energetic electromagnetic field into the plasma zone 55, such as an inductive, capacitive, or microwave field. Preferably, the plasma generator comprises both an inductive and a capacitive plasma source. The inductor coil 75 adjacent to the process chamber 50 that forms an inductive electric field in the chamber when powered by a coil power supply 76 operated using an RF current at a first source power level that is preferably from about 100 Watts to about 3000 Watts; at preferably a frequency of about 2 MHz.

Typically, a capacitive Rf electric field is formed in the chamber using the cathode and anode electrodes 60, 65, powered by an electrode power supply 78 operated using an RF voltage at a second power level of preferably about 100 to about 2000 Watts. The capacitive electric field is perpendicular to the plane of the substrate 10, and accelerates inductively formed plasma species toward the substrate 10 to provide more vertically oriented anisotropic etching of the substrate. The frequency of the RF voltage applied to the process electrodes 60, 65, and/or the inductor coil 75 is typically from about 50 Khz to about 60 MHZ, and more typically about 13.56 MHZ.

Preferably, the process chamber 50 comprises a quasi-remote plasma zone 55 that provides enhanced plasma etching properties. The quasi-remote plasma zone 55 is defined by the region bounded by (i) the substrate 10, (ii) chamber sidewalls 80 adjacent to the substrate, and (iii) the ceiling 85 of the chamber having an apex at a height H of from about 100 mm to about 175 mm (4 to 7 inches) above the substrate 10. It should be noted that the ceiling height can vary for different diameter substrates, the ceiling height described herein being suitable for substrates having diameters of from about 150 mm to about 304 mm (6 to 12 inches). Preferably, the quasi-remote plasma zone 55 comprises a volume of at least about 10,000 cm$^3$, and more preferably from about 10,000 to about 50,000 cm$^3$. In the quasi-remote plasma zone, the plasma is formed directly below the ceiling 85 and immediately above the substrate 10. Preferably, the quasi-remote plasma zone 55 has a center 88 located at a distance of about 50 to about 150 mm directly above the substrate 10, and more preferably at a distance that is greater than about 75 mm and less than about 125 mm from the substrate 10.

It is believed that the quasi-remote plasma zone 55 provides reduced recombination of active dissociated ions into inactive non-dissociated ions as compared to conventional remote plasma zones, such as for example, microwave plasma apparatus. When the center 88 of the plasma zone 55 is remote from the substrate 10 and the plasma ion has to travel a large distance (typically greater than about 30 cms) from the remote plasma source to the substrate 10. Conversely, if the center 88 of the plasma zone 55 is too close to the substrate 10, i.e., less than about 10 cms, the high power current applied to the plasma generator to increase dissociation causes the plasma ions to have excessively high kinetic energies which results in uncontrollable etching performance. Also, if the volume of the plasma zone 55 is too small, it is difficult to form dissociated plasma ions because the mean free path of the energized inert gas ions is excessively small, resulting in fewer collisions between the inert gas ions and the etchant gas molecules. If the center of the plasma zone is too far from the substrate 10, or if the volume of the plasma zone 55 is excessively large, the dissociated ions in the plasma zone recombine to form non-dissociated species before they actually reach the substrate 10. For these reasons, it is preferred to use the quasi-remote plasma zone 55 for etching of the substrate 10.

The ceiling 85 of the process chamber 50 can be flat or rectangular shaped, arcuate, conical, dome-shaped, or multi-radius dome-shaped. Preferably, the process chamber 50 has a multi-radius dome-shaped ceiling 85 above the substrate 10 to provide a uniform distribution of plasma source power across the entire volume of the plasma zone 55 to increase dissociation of the etchant gas, as for example described in U.S. patent application Ser. No. 08/596,960, to Diana Ma, et al., entitled "Plasma Process for Etching Multicomponent Alloys," filed on Feb. 5, 1996, which is incorporated herein by reference. The multi-radius dome-shaped ceiling 85 reduces dissociated ion recombination losses near the substrate 10 to less than those experienced with a flat ceiling, so that plasma ion density is more uniform across the substrate 10. This is because ion recombination losses are affected by the proximity of the ceiling 85, and the dome-shaped ceiling is further from the substrate center than a flat ceiling.

Preferably, the inductor coil 75 is wrapped around the sidewall 80 of the process chamber 50 in the form of a multi-radius dome-shaped inductor coil having a "flattened" dome shape that provides more efficient use of plasma source power and increased plasma ion density directly over the substrate 10 center. This is because ion density is affected by local ionization near the inductor coil 75, and a multi-radius inductor coil is closer to the substrate center than a hemispherical coil. In another preferred embodiment, the ceiling 85 comprising a multi-radius dome having at least a center radius R and a corner radius r less than the center radius R, wherein R/r is from about 2 to about 10.

The plasma formed in the quasi-remote plasma zone 55 can also be enhanced using magnetically enhanced reactors, in which a magnetic field generator, such as a permanent magnet or electromagnetic coils, are used to apply a magnetic field in the plasma zone 55 to increase the density and uniformity of the plasma. Preferably, the magnetic field comprises a rotating magnetic field with the axis of the field rotating parallel to the plane of the substrate 10, as described in U.S. Pat. No. 4,842,683, issued Jun. 27, 1989, which is incorporated herein by reference. The magnetic field in the chamber 50 should be sufficiently strong to increase the density of the ions formed in the plasma, and sufficiently uniform to reduce charge-up damage to features such as CMOS gates. Generally, the magnetic field as measured on a surface of the substrate is less than about 500 Gauss, more typically from about 10 to about 100 Gauss, and most typically from about 10 Gauss to about 30 Gauss.

Spent process gas and etchant byproducts are exhausted from the process chamber 50 through an exhaust system 95 capable of achieving a minimum pressure of about 10$^{-3}$ mTorr in the process chamber 50. A throttle valve 100 is provided in the exhaust for controlling the pressure in the chamber 50. Also, an optical endpoint measurement technique is often used to determine completion of the etching process for a specific layer by measuring the change in light emission of a particular wavelength corresponding to a detectable gaseous species. A sudden decrease or increase in the amount of the detectable species, such as silicon species, that results from chemical reaction of the process gas with the silicon dioxide layer 26, indicates completion of etching of the tungsten containing layer 25 and start of etching of the underlying layer.

The etching process gas composition of the present invention provides highly anisotropic etching of the tungsten containing layers 30 with high etch rates and good etching selectivity relative to the underlying silicon dioxide layer 15. The etching process uses a process gas comprising (i) sulfur hexa-fluoride ($SF_6$), (ii) methyl trifluoride ($CHF_3$), and (iii) nitrogen ($N_2$). The $SF_6$ gas dissociates in the plasma to form dissociated atomic fluorine-containing species that chemically etch the tungsten containing layer 25 on the substrate 10. For example, tungsten containing material is etched by fluorine-containing ions and neutrals to form volatile $WF_x$ species that are exhausted from the chamber 50. It is believed that $SF_6$ gas provides a high ratio of dissociated fluorine ions relative to non-dissociated fluorine ions in the quasi-remote plasma zone of the present apparatus, that enhances etching anisotropy and etching selectivity.

Preferably, the process gas consists essentially of $SF_6$, $CHF_3$, and $N_2$. It has been discovered that the addition of $CHF_3$ and $N_2$ gas to the $SF_6$ gas provides significantly higher anisotropic etching of the tungsten containing layer 25 with little or no change in the critical dimensions of the etched features 35. The critical dimensions ("CD") are the pre-defined and desirable dimensions of the etched features, which are used to determine the electrical properties of the etched features, in the design of integrated circuits. The critical dimensions are dimensions of etched features that can have a significant effect on its electrical properties. For example, the electrical resistance of metal interconnect lines is proportional to the cross-sectional area of the etched features, particularly, the height and width of the etched features. As the dimensions of etched features are diminished due to advances in etching technology, the cross-sectional area of the interconnect lines becomes a critical dimension that should be maintained as close to the desired dimensions as possible to provide the required electrical resistance levels. Thus, tapering cross-sections, cross-sectional profiles that vary as a function of the spacing between the features, or other variations in the profile of the features is no longer acceptable in modern integrated circuits. Critical dimension measurements are typically made using cross-sectional scanning electron micrographs of the substrate before and after etching. The average width ($W_r$) of resist features 30 formed on the blanket tungsten layer 25 is measured prior to etching; and after etching a second width ($W_e$) of the etched features 35 is measured. The critical dimension loss is the difference between the two dimensions of $W_r-W_e$; and the % critical dimension loss is $(W_r-W_e)/W_r \times 100\%$. The minimum critical dimension is the average value of the smallest width across the cross-sections of the etched features 35. It is desirable to maintain critical dimension loss of less than 300 Å, and more preferably, less than 100 Å. It is further desirable to provide a percent critical dimension loss of less than 4% and more preferably less than 2%.

The present gas chemistry provides excellent control of the critical dimensions of the etched features and highly anisotropic etching of the features. It is believed that process gas consisting essentially of $SF_6$, $CHF_3$, and $N_2$, forms a sufficient amount of "passivating" polymeric species (typically $C_xO_yN_z$ containing polymeric species) in the plasma to form passivating films that protect the etched sidewalls 40 of the features 35, and reduce isotropic etching, tapering, and undercutting of the etched features 35. At the same time, the thickness of the passivating film is controlled to prevent formation of excessively thick passivating films on the etched tungsten features. It is difficult to measure the thickness of the passivating polymeric film formed on the etched features, however, it has been found that excessively thick passivating films provide etched features having a tapered profile which is thicker at the bottom and thinner at the top. Although controlling the thickness of the passivating film deposits, the $CHF_3$ and $N_2$ gas addition does not reduce etching selectivity (which is reduced when the rates of etching of the silicon dioxide underlayer 15 are increased). It is believed that the nitrogen gas significantly increases the rate of dissociation of the $SF_6$ and $CHF_3$, gases. The increased number of dissociated ions and neutrals increases the rate of etching of the tungsten containing layer 25, and also increase the amount of $C_xO_yN_z$ passivating species that are deposited on the sidewalls 40 of the freshly etched features 35 thereby maintaining the critical dimensions of the etched feature. Because the atomic and molecular constituents of an active plasma are difficult to analyze, the nature or composition of the volatile passivating species is difficult to determine with accuracy.

Thus, the ratio of the flow rate of $SF_6$ to the combined flow rate of the $CHF_3$ and $N_2$ gases is selected to provide a controlled etch rate, highly anisotropic etching, and to limit the thickness of passivating film deposited on the etched features 35. An excessively high flow ratio of $SF_6$ relative to the combined flow rate of the $CHF_3$ and $N_2$ gas provides etching rates that are uncontrollable, particularly at the end of the etching process, due to the large number of dissociated fluorine species. However, an excessively low flow ratio of $SF_6$ relative to the combined flow rate of the $CHF_3$ and $N_2$ gas can cause isotropic etching of the features by removing the passivating deposits formed on sidewalls 40 of the etched features 35 to provide cone shaped tapered features. Thus, the flow rate of the $SF_6$ relative to the combined flow rate of the $CHF_3$ and $N_2$ gas is maintained at a level that provides a sufficient ratio of dissociated etching fluorine-containing species to non-etchant passivating species to rapidly etch the tungsten containing layer 25 with the desired level of anisotropy and etch rate control.

The composition and volumetric flow ratios of different constituents of the process gas are also selected to provide anisotropically etched features 35 having sidewalls 40 with smooth surfaces that form angles ($\alpha$) of at least about 88° with a plane of the substrate 10, and more preferable angles from about 89° to about 90°. Anisotropically etched features 35 result when the tungsten containing layers are etched substantially vertically to provide features having straight sidewalls 40. Excessive etching at the sidewalls 40 of the etched features 35 results in undesirable inwardly or outwardly sloped walls. A high degree of anisotropic etching is obtained when dissociated species in the etchant gas combine to deposit passivating layers on the sidewalls 40 of freshly etched features 35 to limit further etching of the sidewalls 40. Anisotropic etching is also obtained by the highly directional kinetic energy of the charged species in the etchant plasma (in the electric field perpendicular to the substrate 10), that causes the plasma species to energetically impinge upon and remove substrate material in the vertical etching direction. However, different materials are sputter etched by highly energized plasma species at the high etch rates to provide little or no control over etching selectivity. For these reasons, it is difficult to obtain highly anisotropic etching in combination with high etching selectivity ratios for etching tungsten containing material relative to underlayers of other materials.

For these reasons, the volumetric flow ratio of the process gas is also selected to etch the tungsten containing layer 25 at a high etching selectivity ratio relative to the underlying silicon dioxide layer 15. The etching selectivity ratio is the ratio of the rate of etching of the tungsten containing layer 25 to the rate of etching of the underlying silicon dioxide layer 24. It is particularly desirable have high etching selectivity ratio for tungsten containing structures having a partially convoluted topography, where portions of the tungsten containing layer 25 are thicker across the substrate 10. Toward completion of the etching process, the thinner portions of the tungsten containing layer 25 are etched through and etching of the underlying silicon dioxide layer begins, while the thicker portions of the tungsten containing layer 25 are still being etched. This effect requires that the silicon containing underlayer below the thinner tungsten containing layer 25 portions be etched at a sufficiently slow etch rate relative to the tungsten containing etch rate that the silicon dioxide layer is not etched through, before completion of etching of the thicker tungsten containing layer 25. It is desirable to etch the tungsten containing layer 25 at a faster rate relative to the rate of etching of the silicon dioxide layer 15. Preferably, the etching selectivity ratio relative to the underlying silicon dioxide layer 15 is at least about 1.2, and more preferably at least about 1.5.

Preferred volumetric flow ratios of $SF_6$:$CHF_3$:$N_2$ are from about 1:1:1 to about 8:1:1, and more preferably, from about 2:1:1 to about 5:1:1, and most preferably about 4:1:1. The ratio of the volumetric flow of $SF_6$ to the combined volumetric flow of $CHF_3$ and $N_2$ is typically from about 0.5:1 to about 3:1, and more preferably about 2:1. For the process chamber size illustrated herein, preferably, the flow rate of $SF_6$ is preferably from about 30 to about 120 sccm; the flow rate of $CHF_3$ is from about 10 to about 40 sccm; and the flow rate of $N_2$ is from about 10 to about 50 sccm. Also, it is preferred to maintain the flow rate of $N_2$ to within about ±50% of the flow rate of $CHF_3$ and more preferably within about 20 sccm of the flow rate of $CHF_3$. For the chamber size described herein, preferably, the total flow rate of the process gas is from about 100 to 200 sccm. It should be understood, however, that process gas flow rates are dependent upon the size of the process chamber and flow rates for different sized chambers that provide the equivalent function and/or etching properties are encompassed within the scope of the present invention.

In certain processes, it may be desirable to add argon to the $SF_6$ to promote the stability of the plasma formed from the highly electronegative $SF_6$ gas. This is sometimes desirable for etching elemental tungsten layers or substrates, which cause plasma instabilities, in the highly electronegative sulfur hexafluoride gas. By plasma instability, it is meant a sporadic or intermittent formation of bright and dark plasma glow regions that are caused by unstable electron and ion levels in the plasma. It is believed that the argon gas promotes plasma stability by providing additional energetic species that strike upon, ionize, and/or dissociate the process gas molecules. However, the argon gas addition may not be desirable when the plasma is sufficiently stable without the additional inert gas.

It has also been discovered that the quasi-remote plasma generator when operated at a particular ratio of source power to bias power serves to balance the etching rate to the rate of deposition and removal of the passivating deposits to provide highly anisotropic etching. The power ratio $P_r$ of the first (or source) current power level applied to inductor coil 75 to the second (or bias) voltage power level applied to the process electrodes 60, 65 is also selected to enhance the ability of the etchant plasma to anisotropically etch the tungsten containing layer 25 without excessive deposition of passivating film on the etched features 35. A high power ratio $P_r$ (obtained by increasing the first power level of the current applied to the inductor coil 75 or reducing the second power level of the voltage applied to the bias process electrodes) increases the amount of dissociated fluorinated etchant species to provide more isotropic etching of the features. Conversely, a low power ratio $P_r$ (obtained from a low first power level to the coil or a high bias electrode power level) can cause excessive and nonuniform sputtering of the deposited passivating film and insufficient dissociation of the etchant gas resulting in more isotropic etching. Typically, increasing the second power level of the RF voltage applied to the process electrodes 60, 65 provides increased kinetic bombardment energy to the plasma species, causing more sputtering of the substrate 10 and deposited passivating film. A preferred power ratio $P_r$ of source to bias power is at least about 4:1, and more preferably from about 8:1 to about 40:1. More preferably, the plasma is formed by applying a current at a first power level of about 200 to 2000 Watts, and more preferably about 1400±200 watts, to the inductor coil 75 adjacent to the plasma zone 55. The plasma ions are attracted to the substrate 10 by applying a voltage at a power level of about 5 to 500 Watts, and more preferably about 40 Watts, to process electrodes 60, 65 in the plasma zone.

Figure 3A:
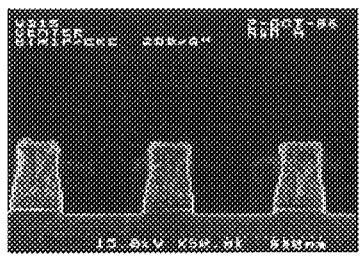
FIG. 3a is a scanning electron micrograph of a cross-sectional view of a substrate having a tungsten layer etched using $SF_6$ and $CHF_3$ showing sharply and outwardly tapered bottleneck sidewall profiles.
Figure 4A:
FIG. 4a is a scanning electron micrograph of a cross-sectional view of a substrate having a tungsten layer etched using $SF_6$ and $N_2$ showing slightly tapered sidewall profiles.
Figure 5A:
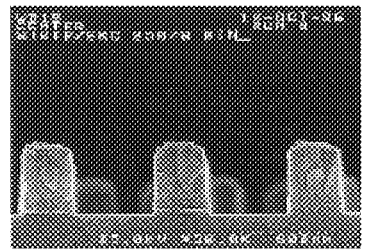
FIG. 5a is a scanning electron micrograph of a cross-sectional view of a substrate having a tungsten layer etched using $SF_6$, $CHF_3$, and $N_2$ showing substantially vertical sidewall profiles.
Figure 3B:
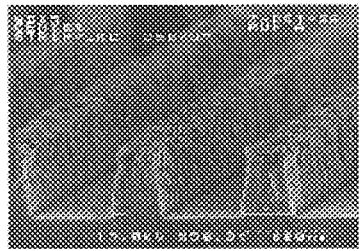
FIG. 3b is a scanning electron micrograph of a partial perspective and sectional view of the substrate of FIG. 3a, showing the rough textured sidewall surfaces of the etched features.
Figure 4B:
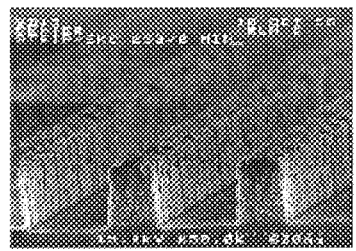
FIG. 4b is a scanning electron micrograph of a partial perspective and sectional view of the substrate of FIG. 4a, showing the rough textured sidewall surfaces of the etched features.
Figure 5B:
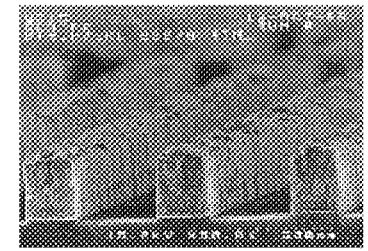
FIG. 5b is a scanning electron micrograph of a partial perspective and sectional view of the substrate of FIG. 5a, showing the smooth sidewall surfaces of the etched features.

FIGS. 3–5 demonstrate the unexpected results obtained using the process gas composition of the present invention. These figures represent scanning electron micrographs of sectional and perspective views of the features etched in the tungsten layer on the substrate 10. In these examples, a 6-inch silicon wafer covered by a silicon dioxide layer was used as the substrate 10. The substrate 10 was coated with a blanket tungsten layer having a thickness of about 600 nm. After the process gas was introduced into the chamber, the chamber pressure was maintained at 10 mTorr. The substrate 10 was maintained at a temperature of 5° C. by flowing helium at a pressure of 8 Torr below the substrate 10. The source power level of the inductor coils was maintained at 1400 Watts, and the bias power level of the process electrodes was maintained at 60 Watts. After etching, the residual resist layer on the features was removed using conventional resist removal methods.

Table I shows the dimensions measured on cross-sections of the features etched on the present substrates. Critical dimension measurements were made using cross-sectional views of scanning electron micrographs of the substrate before and after etching. The SEM micrographs were used to measure the average width ($W_r$) of resist features 30 formed on the blanket tungsten layer prior to etching. After etching, a second width ($W_e$) of the etched features 35 was measured. The critical dimension loss was the difference $W_r-W_e$ and the % critical dimension loss was $(W_r-W_e)/W_r \times 100\%$. The minimum critical dimension was measured as an average value of the smallest width across the cross-sections of the etched features 35.

FIG. 3a shows the cross-sectional profile of tungsten features etched using a process gas comprising 60 sccm $SF_6$ and 30 sccm $CHF_3$. No nitrogen was added to this etchant gas. It is seen from FIG. 3a that the sidewalls 40 of the etched features 35 are generally tapered and sloped outwardly from the top of the feature to the bottom of the feature, which is undesirable. In addition, the etch features have a narrower bottleneck region, at approximately three-quarters the height of the feature.

TABLE I

|  | Example 1 | Example 2 | Example 3 |
|---|---|---|---|
| Minimum Critical Dimension | 0.24 μm | 0.30 μm | 0.32 μm |
| Critical Dimension Loss | −800 Å | −200 Å | <50 Å |
| % Critical Dimension Loss | 25% | 6.3% | <1.5% |
| Profile | Bowing | Tapered | Vertical |
| Profile Angle | N/A | 87° | 89–90° |

The dimensional measurements made on the etched features 35 of Example 1 are shown in Table I, which demonstrate that a process gas comprising $SF_6$ and $CHF_3$ without addition of nitrogen, results in more isotropic etching and critical dimensions that have a smaller width than the overlying resist feature. Specifically, the etched features 35 had a minimum critical dimension of 0.24 μm, a high loss of critical dimension of about 800 Å., and a % critical dimension loss of 25%. Such a high critical dimension loss is undesirable because they are reflective or narrowing and non-uniform cross-sections of the etched features 35. The narrow cross-sections increase the resistivity of the etched feature by providing a smaller area. The relatively large loss of critical dimension also prevents the ability to accurately design engineer the integrating circuits formed on the substrate 10.

In Example 2, a etchant process gas comprising 60 sccm $SF_6$ and 30 sccm $N_2$ was used. No $CHF_3$ gas was added to this process etchant gas. This process gas composition provided better results than that of Example 1 showing etched features 35 having sidewalls 40 that taper only slightly outwardly from the top of the feature to the bottom of the feature. This indicates a slightly higher degree of anisotropic etching. The dimension measurements of these etched features 35, as shown in Table I, include a minimum critical dimension of 0.30 μm, a critical dimension loss of 200 Å, and a % critical dimension loss of 6.3%. The profile angle of the sidewalls 40 of the features was measured to be about 87°. This profile angle is relatively low, and angles exceeding 88° and preferably 89° to 90°, are more desirable. The etched features 35 also had rough sidewalls 40 and exhibited a high loss of critical dimension.

In Example 3, the tungsten features were etched using the process gas composition of the present invention, namely 60 sccm $SF_6$, 15 sccm, $CHF_3$, and 15 sccm $N_2$. The SEM micrographs show the unexpected highly anisotropic etching of the features provided by this process gas composition. In these examples, the features have substantially perpendicular sidewalls 40 with substantially no tapering from the top of the feature to the bottom of the feature. The minimum critical dimension loss was relatively low at 0.32 μm, and the critical dimension loss was less than 50 Å. The % critical dimension loss was 1.5%, which is about 4 to more than 10 times lower than the % critical dimension loss provided by the other etchant gas compositions. Profile angles in the desired 89° to 90° range were obtained and the profiles comprise substantially uniformly vertical sidewalls 40. The sidewalls 40 of the etched features 35 were relatively smooth without serrated edges. These unexpected results of the anisotropic etching and excellent cross-sectional profile of the etched features 35 demonstrate the advantage of the present process.

Although the present invention has been described in considerable detail with regard to the preferred version thereof, other versions are possible. For example, the plasma can be formed using a microwave plasma source, and equivalent gases can be substituted for the gases described herein. Therefore, the appended claims should not be limited to the description of the preferred versions contained herein.

What is claimed is:

1. A method of anisotropically etching a tungsten containing layer on a substrate, the method comprising the steps of:

(a) placing the substrate in a plasma zone;

(b) introducing into the plasma zone, a process gas comprising $SF_6$, $CHF_3$, and $N_2$; and (c) forming a plasma from the process gas to etch the tungsten containing layer on the substrate (i) substantially anisotropically, and (ii) without forming excessive passivating deposits on the substrate.

2. The method of claim 1, wherein the volumetric flow ratio of $SF_6$:$CHF_3$:$N_2$ is selected to provide etched features having (i) a critical dimension loss of less than 4%, and (ii) sidewalls that form angles of at least about 88° with a surface of the substrate.

3. The method of claim 1, wherein the volumetric flow ratio of $SF_6$:$CHF_3$:$N_2$ is from about 1:1:1 to about 8:1:1.

4. The method of claim 3, wherein the volumetric flow ratio of $SF_6$:$CHF_3$:$N_2$ is from about 2:1:1 to about 5:1:1.

5. The method of claim 1, wherein the process gas consists essentially of $SF_6$, $CHF_3$, and $N_2$.

6. The method of claim 1, wherein in step (c), the plasma is formed by applying a current at a power level of about 200 to 2000 Watts to an inductor coil adjacent to the plasma zone, and by applying a voltage at a power level of about 5 to 500 Watts to process electrodes in the plasma zone.

7. A method of etching a substrate comprising a tungsten containing layer, the method comprising the steps of:

(a) placing the substrate in a process chamber comprising (i) process electrodes therein, and (ii) an inductor coil adjacent to the process chamber;

(b) introducing into the process chamber, process gas comprising $SF_6$, $CHF_3$, and $N_2$; and (c) ionizing the process gas to form plasma ions that energetically impinge on the substrate by (i) applying RF current at a first power level to the inductor coil, and (ii) applying RF voltage at a second power level to the process electrodes, wherein a power ratio $P_r$ of the first power level to the second power level is selected so that the tungsten containing layer is substantially anisotropically etched without excessive deposition of passivating material on the substrate.

8. The method of claim 7, wherein the power ratio $P_r$ of the first power level to the second power level and the volumetric flow ratio of $SF_6$:$CHF_3$:$N_2$ is selected to provide etched features having (i) a critical dimension loss of less than 4%, and (ii) sidewalls that form angles of at least about 88° with a surface of the substrate.

9. The method of claim 7, wherein the power ratio $P_r$ of the first power level to the second power level is at least about 4:1.

10. The method of claim 9, wherein the power ratio $P_r$ of the first power level to the second power level is from about 8:1 to about 40:1.

11. The method of claim 7, wherein the first power level is from about 200 to about 2000 Watts.

12. The method of claim 7, wherein the second power level is about 5 to about 500 Watts.

13. The method of claim 7, wherein the volumetric flow ratio of $SF_6$:$CHF_3$:$N_2$ is from about 1:1:1 to about 8:1:1.

14. The method of claim 13, wherein the volumetric flow ratio of $SF_6$:$CHF_3$:$N_2$ is from about 2:1:1 to about 5:1:1.

15. The method of claim 7, wherein the process gas consists essentially of $SF_6$, $CHF_3$, and $N_2$.

16. A method of etching a substrate comprising a tungsten containing layer, the method comprising the steps of:
(a) placing the substrate in a process chamber comprising (i) process electrodes therein, and (ii) an inductor coil adjacent to the process chamber;
(b) introducing into the process chamber, process gas comprising $SF_6$, $CHF_3$, and $N_2$ in a volumetric flow ratio of from about 1:1:1 to about 8:1:1; and
(c) ionizing the process gas to form plasma ions that energetically impinge on the substrate by (i) applying RF current at a first power level to the inductor coil, and (ii) applying RF voltage at a second power level to the process electrodes, wherein a power ratio $P_r$ of the first power level to the second power level is selected so that the tungsten containing layer is substantially anisotropically etched without excessive deposition of passivating material on the substrate.

17. The method of claim 16, wherein the power ratio $P_r$ of the first power level to the second power level is selected to provide etched features having (i) a critical dimension loss of less than 4%, and (ii) sidewalls that form angles of at least about 88° with a surface of the substrate.

18. The method of claim 16, wherein the power ratio $P_r$ of the first power level to the second power level is at least about 4:1.

19. The method of claim 16, wherein the power ratio $P_r$ of the first power level to the second power level is from about 8:1 to about 40:1.

20. The method of claim 16, wherein the first power level is from about 200 to about 2000 Watts.

21. The method of claim 16, wherein the second power level is about 5 to about 500 Watts.

22. The method of claim 16, wherein the volumetric flow ratio of $SF_6$:$CHF_3$:$N_2$ is from about 2:1:1 to about 5:1:1.

* * * * *